United States Patent [19]

Akai et al.

[11] Patent Number: 4,701,874

[45] Date of Patent: Oct. 20, 1987

[54] DIGITAL SIGNAL PROCESSING APPARATUS

[75] Inventors: Takashi Akai; Katsuro Okamoto, both of Tokyo; Shiro Usui, Toyohashi, all of Japan

[73] Assignee: NEC Corporation, Japan

[21] Appl. No.: 560,447

[22] Filed: Dec. 12, 1983

[30] Foreign Application Priority Data

Apr. 6, 1983 [JP] Japan .................. 58-60263
Apr. 8, 1983 [JP] Japan .................. 58-61736

[51] Int. Cl.⁴ .............................................. G06F 7/38
[52] U.S. Cl. ................................................ 364/724
[58] Field of Search ....................................... 364/724

[56] References Cited

U.S. PATENT DOCUMENTS

| 4,104,729 | 8/1978 | Gingell | 364/724 |
| 4,366,547 | 12/1982 | Miller | 364/724 |
| 4,369,499 | 1/1983 | Northam | 364/724 |
| 4,374,426 | 2/1983 | Burlage et al. | 364/724 |
| 4,430,721 | 2/1984 | Acampora | 364/724 |
| 4,455,665 | 6/1984 | Kromer, III | 364/724 |
| 4,524,423 | 6/1985 | Acampora | 364/724 |
| 4,641,259 | 2/1987 | Shan et al. | 364/724 |

Primary Examiner—Gary V. Harkcom
Assistant Examiner—Dale M. Shaw
Attorney, Agent, or Firm—Ostrolenk, Faber, Gerb & Soffen

[57] ABSTRACT

A digital signal processing apparatus is disclosed. A delay circuit generates $(2p+1)$ signals $x_{k-n}$ to $x_{k+n}$ ($n=0, 1, 2, \ldots, p$), each having a difference respective delay time. The apparatus further comprises a computation circuit responsive to the foregoing signal for computing $$y_k = h_0 x_k + \sum_{n=1}^{p} h_n (x_{k+n} + j \cdot x_{k-n}),$$

wherein coefficients $j$ and $h_0$ to $h_n$ are "$\pm 1$" and "1" or "0", respectively.

9 Claims, 16 Drawing Figures

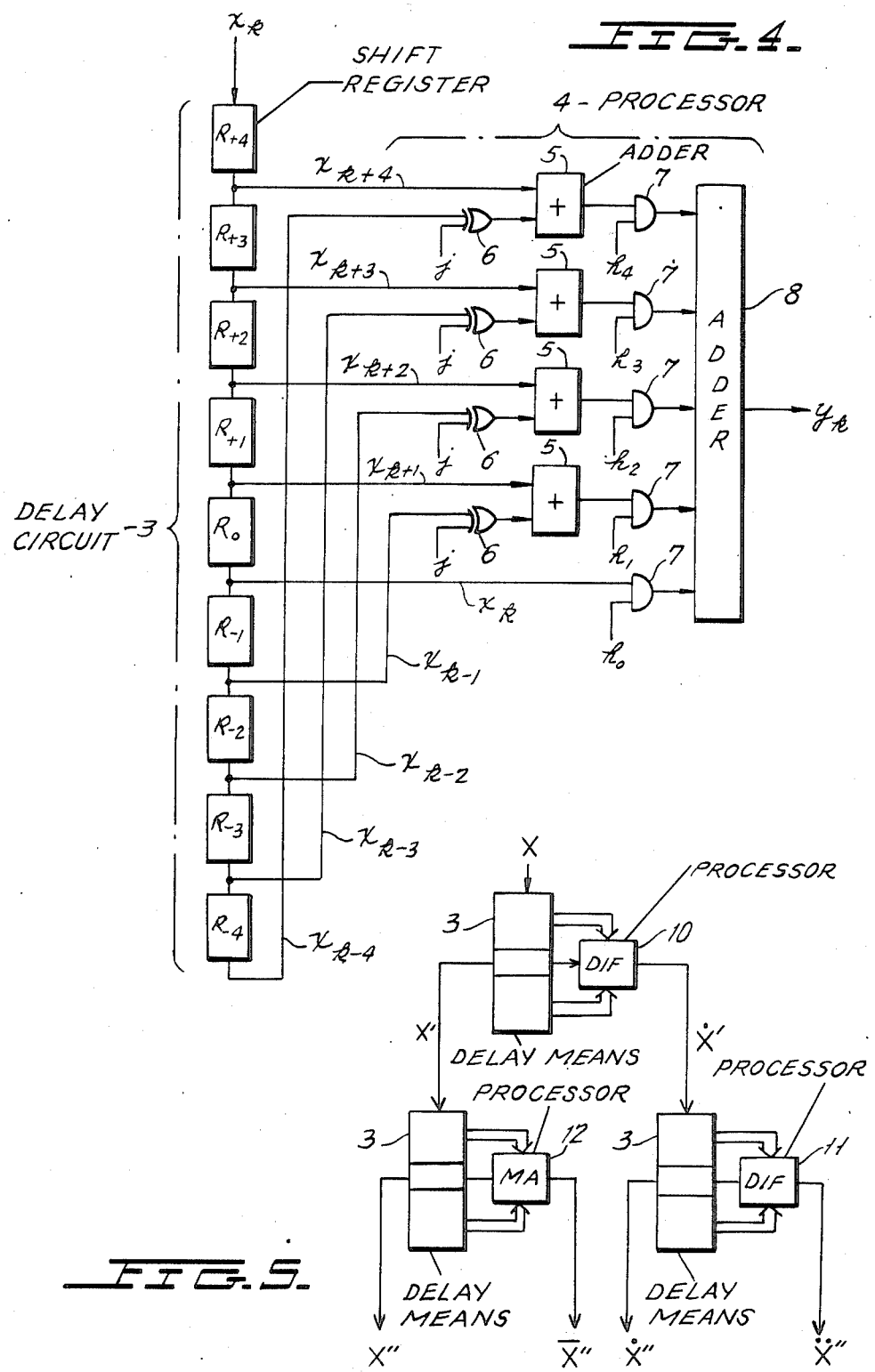

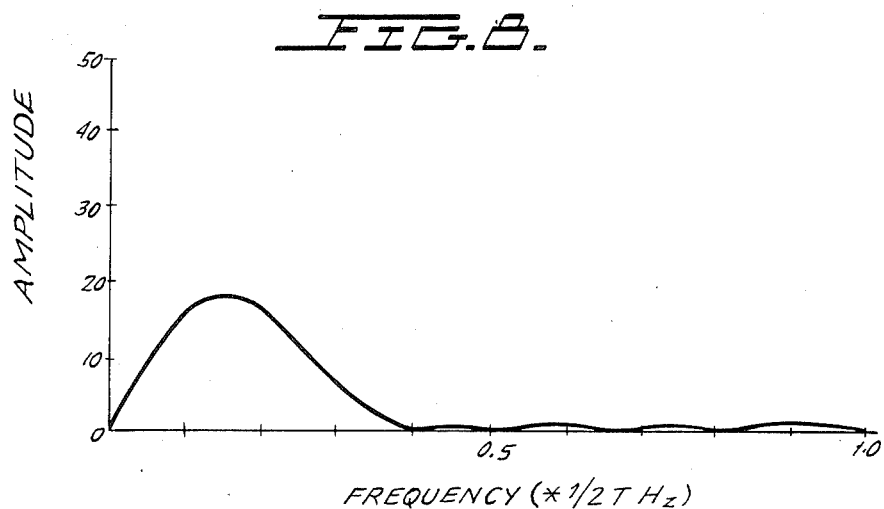
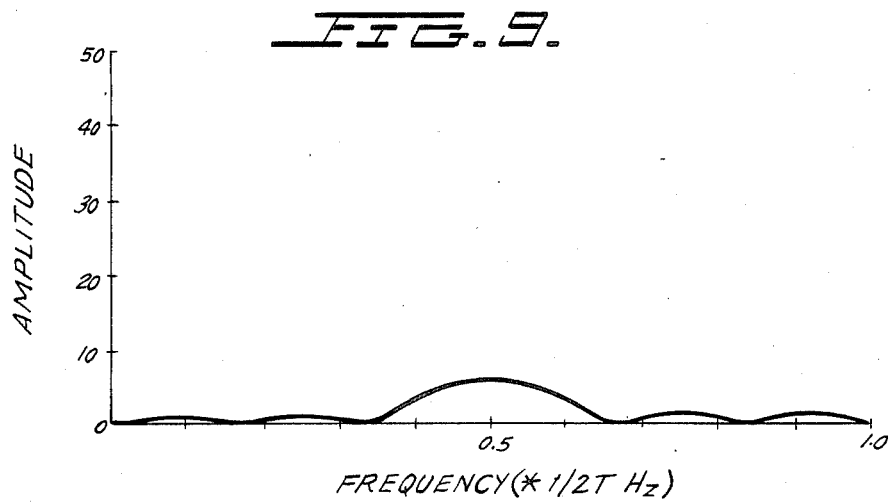

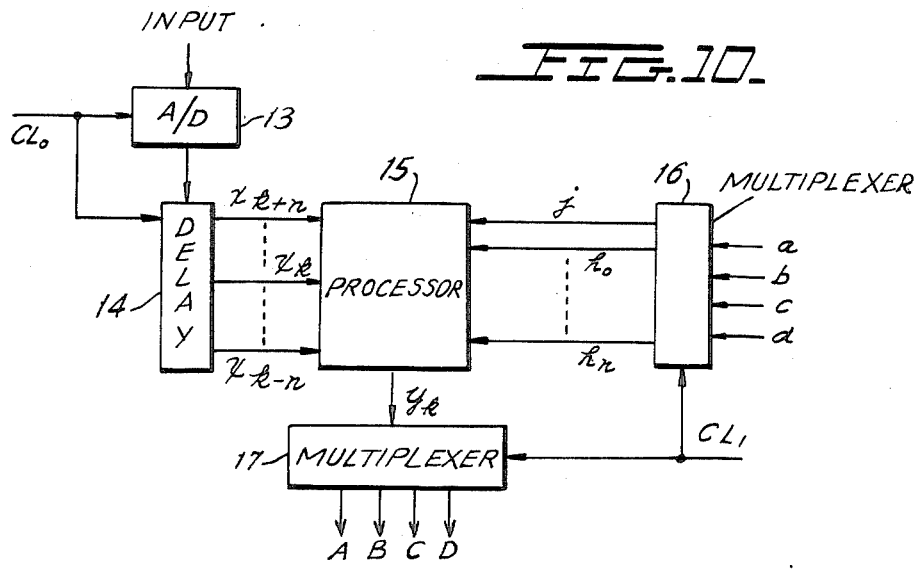
FIG.10
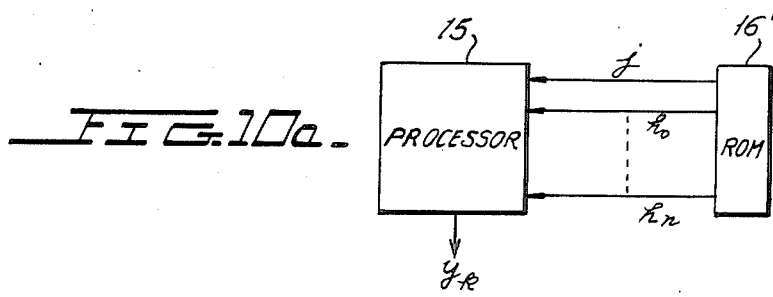
FIG.10a
FIG.11
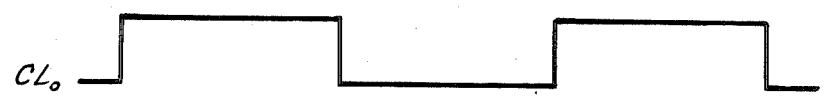
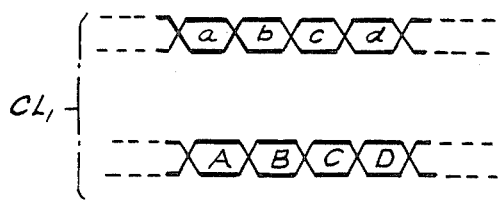

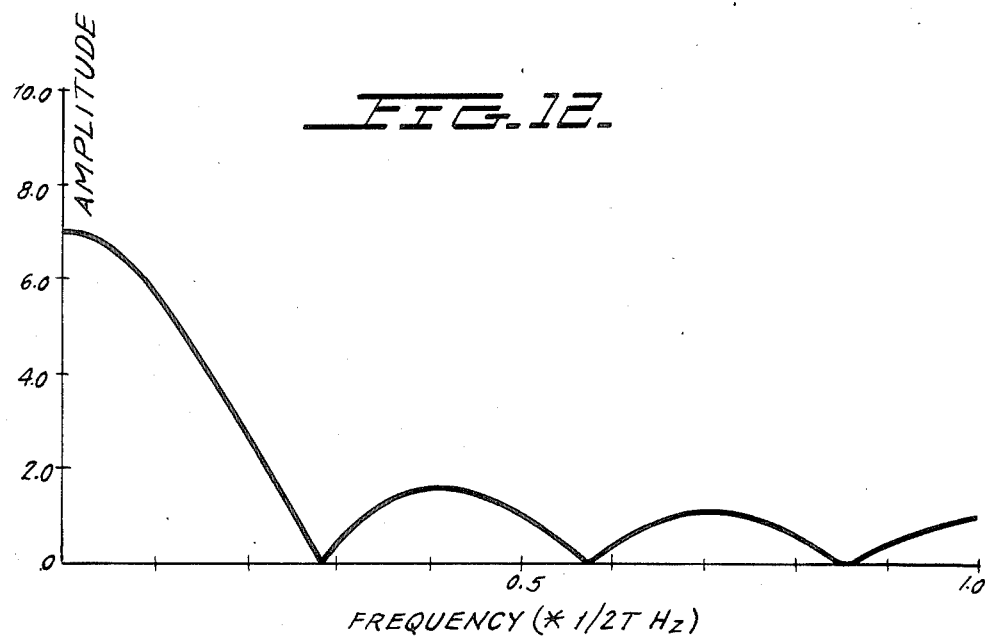
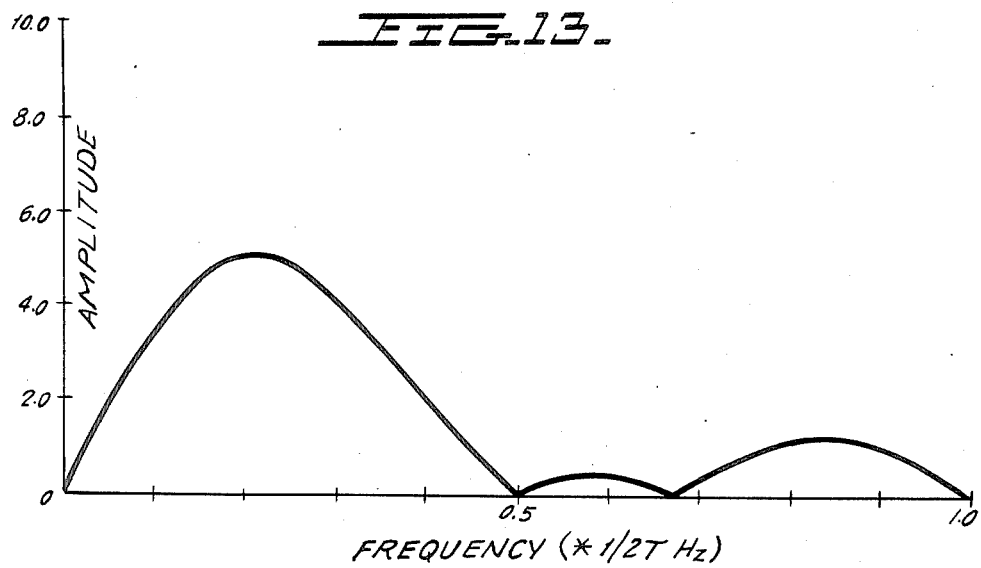

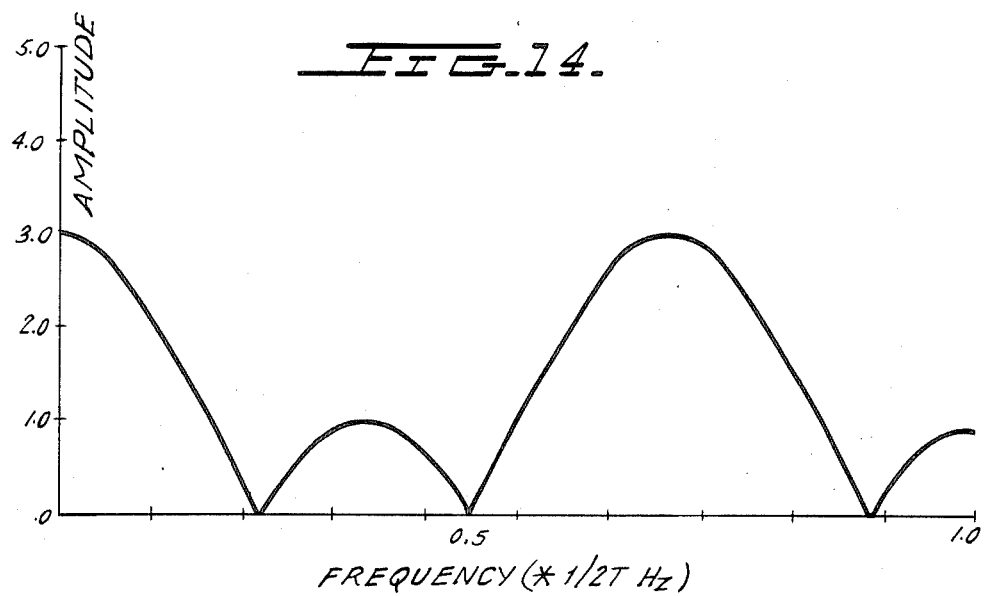
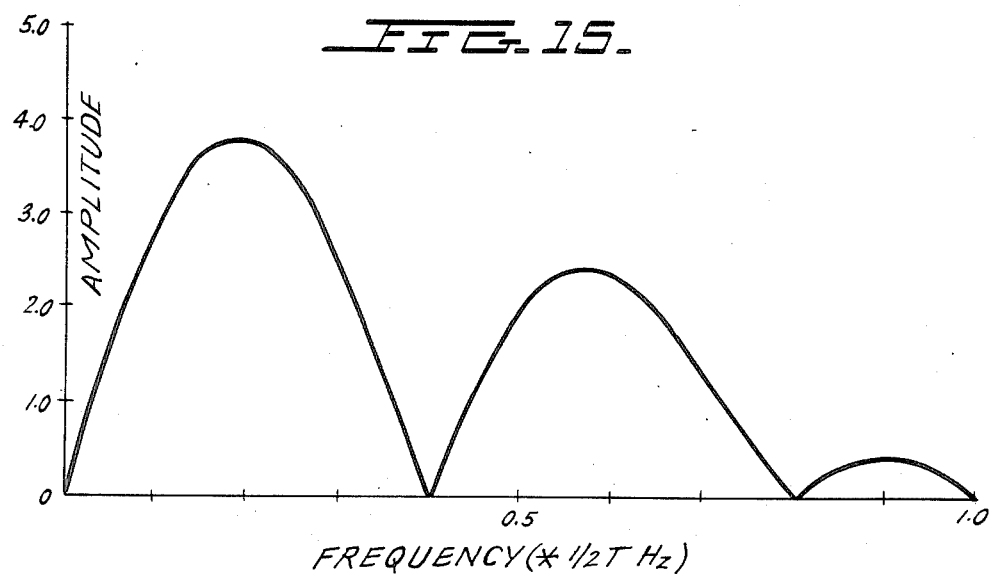

DIGITAL SIGNAL PROCESSING APPARATUS

BACKGROUND OF THE INVENTION

This invention relates to signal processing, and more particularly to a digital signal processing apparatus.

A sensed video signal or a detected signal, for example, an electrocardiogram signal is in many cases subjected to a special filtering process, for example, a differentiation filtering process and a smoothing filtering process for various analyses. These filtering processes are carried out at present using digital techniques. In order to filter a digital signal represented by a discrete time-series signal, multiplication and division processes are generally required. When such filtering process is done by means of software with a minicomputer or a microcomputer in accordance with a prior art technique, the filtering process such as the multiplication and division processes is performed by repeated calculation steps, which require a great deal of processing time. Therefore, it is difficult to carry out such filtering process in real time base by the software. On the other hand, when such filtering process is performed by means of a specific hardware, a complicated circuit configuration is required. Further, since a computation speed is influenced by data length of the digital signal, highly-accurate computation circuit elements are required.

In the prior art described above, different circuit configurations are required for different filtering processes, such as differentiation and smoothing processes. Since such different circuit configurations require different processing times, output signals having different time phases are delivered therefrom when an input digital signal represented by the time-series signal is inputted into different filters at the same instant. In other words, it is difficult to synchronize these output signals delivered from the different filters with each other.

SUMMARY OF THE INVENTION

An object of the present invention is to provide a digital signal processing apparatus capable of carrying out differing processing operations, such as primary differentiation filtering, high-order differentiation filtering and smoothing filtering, and preventing the occurrence of a phase difference between output signals delivered by different filtering processes.

Another object of the present invention is to provide a signal processing apparatus capable of obtaining a plurality of processed output signals from different kinds of filtering within a sample period of an input digital signal when one circuit configuration is used.

According to a first feature of the present invention, there is provided a digital signal processing apparatus which comprises a plurality of filtering apparatus, each of which includes a delay circuit array adapted to delay an input digital signal serially by a predetermined period to produce delayed output signals $x_{k \pm n}$ (n=0, 1, .., p) and a means responsive to the output signals $x_{k+n}$ and $x_{k-n}$ obtained from the delay circuit array for calculating $$\sum_{n=0}^{p} h_n(x_{k+n} + jx_{k-n})(j = \pm 1\ h_n = 1\ \text{or}\ 0),$$

these filtering apparatus being cascade-connected to have a dendriform structure to synchronously obtain a plurality of different filtered output signals therefrom.

According to a second feature of the present invention, there is provided a signal processing apparatus, which comprises a delay circuit array adapted to delay an input digital signal serially by a predetermined period to produce delayed output signals $x_{k \pm n}$ (n=0, 1, .., p), a means responsive to the output signals $x_{k+n}$ and $x_{k-n}$ for calculating $$\sum_{n=0}^{p} h_n(x_{k+n} + jx_{k-n})(j = \pm 1; h_n = 0\ \text{or}\ 1),$$

and a means for designating different combinations of $h_n$ and $j$ within one shifting period of the delay circuit array, and which is adapted to deliver a plurality of different filtered signals.

BRIEF DESCRIPTION OF THE DRAWINGS

FIG. 4 shows the construction of the processor shown in FIG. 3, in which p=4;

FIG. 5 shows an embodiment of the present invention, in which a plurality of processors, each of which is shown in FIG. 3, are cascade-connected to have a dendrarchy;

FIGS. 6-9 show characteristics of filtered output signals according to the embodiment of present invention shown in FIG. 5;

FIG. 10 shows a second embodiment of the present invention;

FIG. 10(a) shows still another embodiment of the present invention, in which a multiplexer shown in FIG. 10 is replaced by a ROM;

FIG. 11 is a timing chart for explaining an operation of the second embodiment; and FIGS. 12-15 show characteristics of other filtered output signals according to the second embodiment of the present invention shown in FIG. 10.

DESCRIPTION OF THE PREFERRED EMBODIMENTS

The present invention will now be described in detail. The ideal frequency characteristic in a low-region differentiation processing operation is expressed by the following equation (1):

$$H^{(1)}(\omega) = \begin{cases} j\omega & |\omega| \leq \alpha \\ 0 & \alpha\pi < \omega < \pi \end{cases} \quad (1)$$

Figure 1:
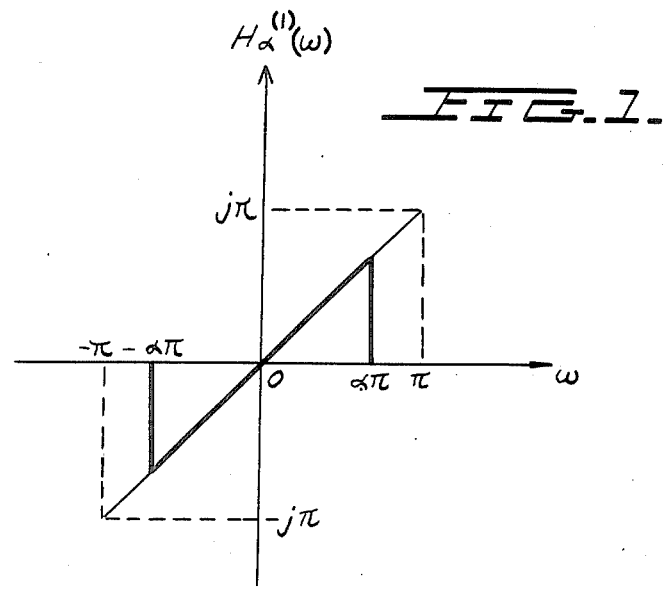
FIG. 1 shows an ideal frequency characteristic in a low-region differentiation processing operation.

In this equation, $\alpha\pi$ ($0 < \alpha < 1$) represents a cut-off frequency, and a sampling period is assumed to be T=1. This frequency characteristic in shown in FIG. 1. When the characteristic expressed by the equation (1) is approximated by a non-cyclic symmetric type FIR filter, a resultant frequency characteristic is determined by the following equation (2):

$$F^{(1)}(\omega) = j \sum_{n=1}^{p} \bar{h}_n \sin n\omega \qquad (2)$$

When the equation (2) is expressed by a time region, output signal $y_k^{(1)}$ of a primary differentiation filtering operation is expressed by a sum of differences between symmetric signals $x_{k+n}$ and $x_{k-n}$ with respect to the center signal $x_k$, as the following equation (3):

$$y_k^{(1)} = \frac{d}{2} \sum_{n=1}^{p} h_n(x_{k+n} - x_{k-n}) \qquad (3)$$

wherein $$\vec{h}_n = d \cdot h_n \text{ and } d = 1 / \sum_{n=1}^{p} (n \cdot h_n)T.$$

In the equation (3), d represents a scale factor (constant), and is independent of the difference value according to the equation (3), so that it may be negligible in intermediate computation. Therefore, the scale factor d is multiplied to the computation result, finally. The equation (3) shows that, when $h_n$ therein is substituted by "0" or "1", the primary differential characteristic can be determined by the differential computation only.

A frequency characteristic in a smoothing operation is now expressed by the following equation (4):

$$F^{(m)}(\omega) = \bar{h}_0^{(m)} + 2 \sum_{n=1}^{p} \bar{h}_n^{(m)} \cos(n\omega) \qquad (4)$$

When the equation (4) is expressed by a time region, an output signal $y_k^{(m)}$ is expressed by a sum of a signal $x_k$ and additions of symmetric signals $x_{k+n}$ and $x_{k-n}$ with respect to the center signal $x_k$ as shown in the following equation (5):

$$y_k^{(m)} = h_0^{(m)} x_k + \sum_{n=1}^{p} h_n^{(m)}(x_{k+n} + x_{k-n}) = \qquad (5)$$

$$\sum_{n=-p}^{p} h_n^{(m)} x_{k+n} \text{ wherein } \bar{h}_n^{(m)} = d \cdot h_n^{(m)}, \text{ and } d = 1/\sum_{n=-p}^{p} h_n^{(m)}.$$

In the equation (4), d represents a scale factor (constant). The equation (5) shows that, when $h_n^{(m)}$ is substituted by "0" or "1", the smoothing characteristic can be determined by a simple sum alone.

Figure 2:
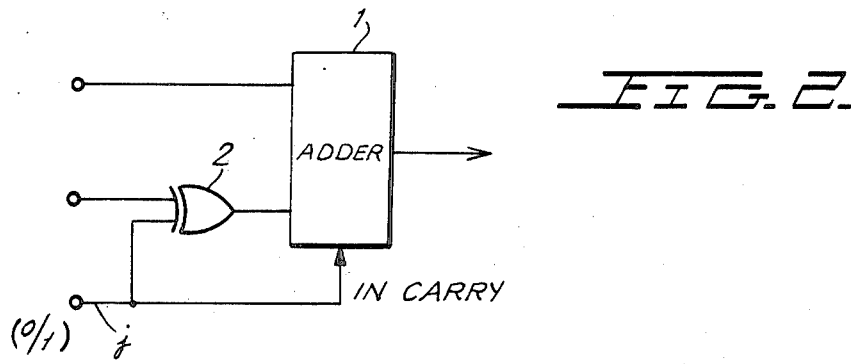
FIG. 2 shows an example of a circuit configuration, in which an adding operation and a subtraction operation are easily switched from one to the other by an external control signal.

Examining the member $(x_{k+n}-x_{k-n})$ of the difference in the equation (3) and the member $(x_{k+n}+x_{k-n})$ of the sum in the equation (5), the latter is equal to the former except the sign of the signal $x_{k-n}$, i.e., the minus sign is converted into the plus sign. This indicates that the smoothing operation based on the equation (5) can be performed by changing the subtraction operation in the equation (3) to an addition operation, and adding the member corresponding to $h_0$. A circuit, which enables the change between the subtraction and the addition in response to a control signal, is shown in FIG. 2. Referring to FIG. 2, one input signal is supplied to an adder 1, while another signal is supplied to the adder 1 after it is processed with an addition and subtraction control signal in an exclusive OR-gate 2. When adder means and signal delay means are connected to the circuit shown in FIG. 2, a signal processing apparatus capable of carrying out differentiation and smoothing operations expressed by the equations (3) and (5) can be formed.

Figure 3:
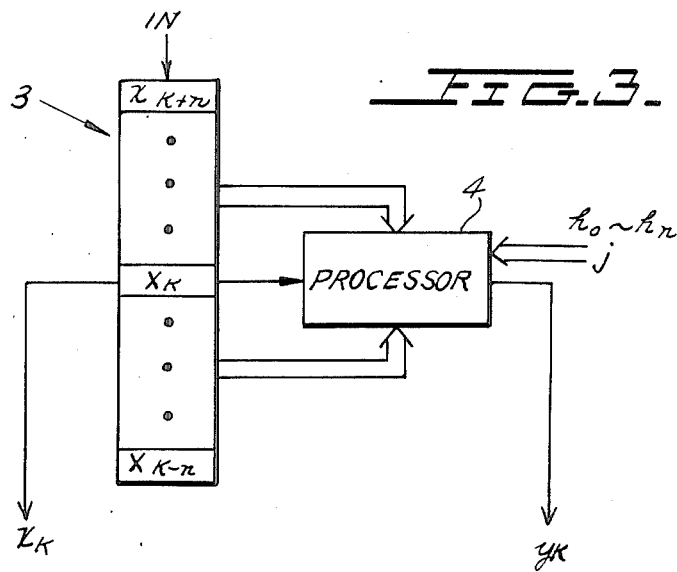
FIG. 3 is a schematic diagram of a processor applied to the present invention.

A digital signal processing apparatus according to the present invention can be expressed by the following equation (6) on the basis of the equations (3) and (5):

$$y_k = h_0 x_k + \sum_{n=1}^{p} h_n(x_{k+n} + j \cdot x_{k-n}) \qquad (6)$$

wherein coefficients $h_0$ and $h_n=0$ or 1; and coefficient $j=\pm 1$. The digital signal processing apparatus corresponding to the equation (6) includes signal delay means and adder means having the addition/subtraction selecting capability, and is shown in FIG. 3. Referring to FIG. 3, the processing apparatus includes the signal delay means 3, for example, shift registers having maximum delay time of $(2p+1)t$ (t: clock period), and a processor 4 for carrying out the computation of coefficients $h_0$ and $h_n$ and the sum or difference in the equation (6). In FIG. 3, when the coefficients j and $h_0$ to $h_n$ are set in accordance with a desired filtering operation, an output signal $y_k$ processed in accordance with the desired filtering operation is delivered and the original input signal $x_k$ having a delay time of $(p+1)t$ is also delivered from the center of the delay means 3. In this case, the filtered output signal $y_k$ is synchronized with the original input signal $x_k$ delivered from the center of the delay means 3.

A digital signal processing apparatus, in which $p=4$, corresponding to that shown in FIG. 3 will now be described with reference to FIG. 4. Nine delayed output signals $x_{k-4}$ to $x_{k+4}$ are extracted from the delay circuit 3, which consists of shift registers $R_{-4}$ to $R_{+4}$. The paired delayed output signals $x_{k-n}$ and $x_{k+n}$ ($n=1, 2, 3, 4$) out of the nine delayed output signals are subjected to addition or subtraction in an adder 5 and an exclusive OR-gate 6. The outputs delivered from the adders 5 are then processed in gates 7 in accordance with control signals corresponding to coefficient $h_n$, which take a value "1" or "0", and the resulting signals are sent to an adder 8. The central delayed output signal $x_k$ is also processed in a gate 7 in accordance with a control signal corresponding to a coefficient $h_0$, and the resulting signal is then sent to the adder 8. Consequently, an filtered output signal $y_k$ expressed by the equation (6) is obtained from the adder 8. In the apparatus shown in FIG. 4, nine registers are used to obtain the nine delayed output signals. Even when eight registers are used, nine delayed output signals can, of course, be obtained if an input signal has an accurate timing. According to the present invention, the coefficients are all set to "1" or "0". This feature enables the construction of the signal processing apparatus to be simplified to a great extent.

An embodiment of the present invention, in which the above-described signal processing apparatus are cascade-connected to have a three-step dendriform, will now be described with reference to FIG. 5. Referring to FIG. 5, processors 10 and 11 work as filters having a differentiation characteristic, and a processor 12 works as a filter having a smoothing characteristic. The operation of this embodiment will be described hereinafter. A primary differentiated signal $\dot{X}'$ with respect to an input signal X can be obtained by the processor 10. This differentiated signal $\dot{X}'$ is delayed by $(p+1)$ clock pulses as compared with the input signal X, and synchronized with an output signal X' delivered from the central portion of the delay means 3. Namely, the time phase of the differential signal $\dot{X}'$ is the same as that of the output signal X'. The signal X' is then smoothed by the processor 12 to obtain an output signal $\overline{X}''$, the phase of which is the same as that of an output signal X'', which is further delayed by (p+1) clock pulses as compared with the signal X'. On the other hand, a secondarily differentiated signal $\ddot{X}''$ with respect to the input signal X is delivered from the processor 11, and an output signal $\dot{X}''$, which is delayed by (p+1) clock pulses as compared with the input signal $\dot{X}'$ to the processor 11, is obtained from the processor 11. Namely, in the last layer of this signal processing apparatus having a dendriform shown in FIG. 5, the smoothed output signal $\overline{X}''$, the primary differentiated output signal $\dot{X}''$ and the secondary differentiated output signal $\ddot{X}''$ are obtained in addition to the input signal X''. The four signals $\overline{X}''$, $\dot{X}''$, $\ddot{X}''$ and X'' are delayed by 2(p+1) clock pulses relative to the input signal X and are synchronized with respect to each other.

Figure 6:
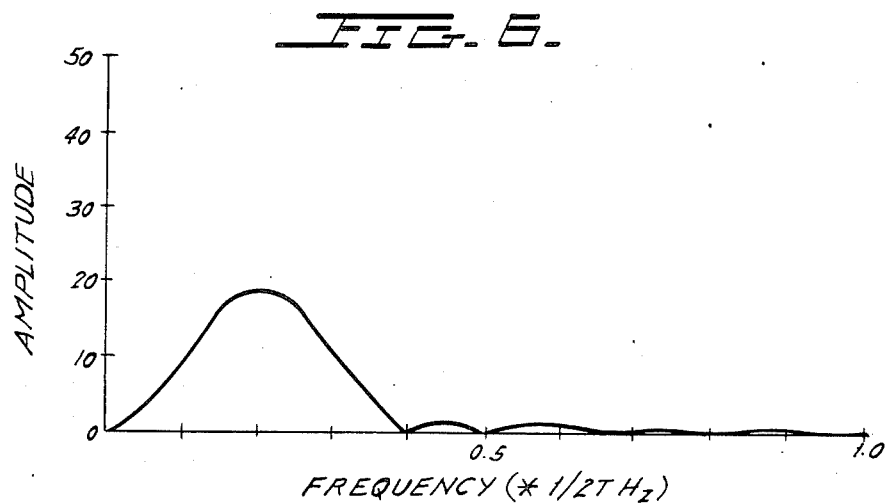

When the coefficients $h_n$ in the equation (6) are varied, the frequency characteristics of the same circuit configuration vary. Such variations in the frequency characteristics will be described. For example, when the processor shown in FIG. 4 is assumed to be a differentiation filtering processor ($h_0=0$, $j=-1$), in which the coefficients $h_1$, $h_2$, $h_3$ and $h_4$ are set to combinations of "0" and "1", fifteen kinds of differentiation characteristics can be obtained. When a smoothing operation is carried out ($j=+1$) by the processor shown in FIG. 4, with the coefficients $h_0$, $h_1$, $h_2$, $h_3$ and $h_4$ set to combinations of "0" and "1", thirty kinds of smoothing characteristics can be obtained. The cases where all of the coefficients $h_0$, $h_1$, $h_2$, $h_3$ and $h_4$ are set to "0", and where the coefficient $h_0$ only is set to "1" are meaningless and excluded. Accordingly, an apparatus having a multilayer dendriform as shown in FIG. 5 enables a very large number of kinds of filtered output signals to be obtained. For example, referring to FIG. 5, let $h_0=0$, $h_1=0$, $h_2=1$, $h_3=1$, $h_4=0$, and $j=-1$ equal the coefficients of the processor 10 for the differentiation filtering at the first layer, and let $h_0=0$, $h_1=1$, $h_2=1$, $h_3=1$, $h_4=0$, and $j=-1$ equal the coefficients of the processor 11 for the differentiation filtering at the second layer. In this case, the frequency characteristics of the output signal at the second layer, i.e. the secondary differentiated output signal $\ddot{X}$ are as shown in FIG. 6.

Figure 7:
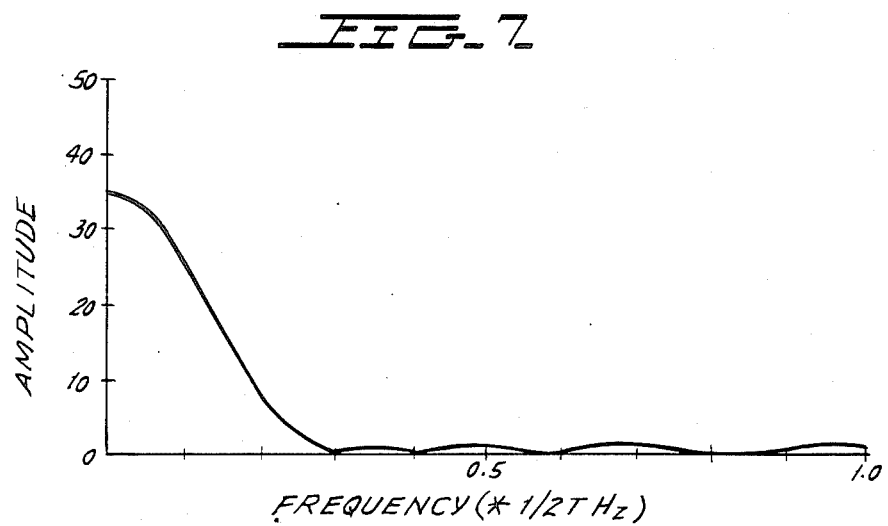

Similarly, FIG. 7 shows a secondary (two-step) smoothing characteristic. The coefficients for the first step are $h_0=1$, $h_1=1$, $h_2=1$, $h_3=0$, $h_4=0$ and $j=1$, and the coefficients for the second step are $h_0=1$, $h_1=1$, $h_2=1$, $h_3=1$, $h_4=0$ and $j=1$.

FIG. 8 shows the differentiation and smoothing characteristic. In the first step, $h_0=0$, $h_1=1$, $h_2=1$, $h_3=1$, $h_4=0$ and $j=-1$, and, in the second step, $h_0=1$, $h_1=1$, $h_2=1$, $h_3=0$, $h_4=0$ and $j=1$. FIG. 9 also shows the differentiation and smoothing characteristic. In the first step, $h_0=0$, $h_1=1$, $h_2=0$, $h_3=0$, $h_4=0$ and $j=-1$, and, in the second step, $h_0=1$, $h_1=0$, $h_2=0$, $h_3=0$, $h_4=1$ and $j=1$.

According to the above-described embodiment of the present invention, the following effects can be obtained: (1) The digital signal processing apparatus according to the present invention requires no multiplication and division circuit configuration as compared with a prior art digital filter, so that even a high-order filtering operation can be carried out at a high speed. (2) Since processors capable of carrying out both a differentiation filtering operation and a smoothing operation are applied to have the dendriform, a differentiation-filtered output signal and a smoothfiltered signal, which have no time phase difference, can be obtained in a final step. (3) When coefficients to be set in processors constructed to have a dendriform are varied in each processor, a differentiation filtering operation and a smoothfiltering operation, which have a large number of types of frequency characteristics, can be carried out without changing the construction of the apparatus. (4) Even when the data length of a input digital signal is increased, the operation speed and the synchronization between a plurality of output signals are not influenced. (5) The apparatus according to the present invention can be formed by adder means and signal delay means, which have comparatively simple construction. Moreover, the elements are merely cascade-connected so as to obtain a plurality of dendriform (tree-like) arrangements. Therefore, the construction of the circuit as a whole can be simplified, and the number of elements can be reduced to a level lower than that in a prior art apparatus.

Next, a second embodiment of the present invention for carrying out a plurality of different filtering operations by one processor will now be described with reference to FIG. 10. In this Figure, a digital input signal sent through an A/D converter 13 is applied to a shift register array 14. The delayed signals $X_{k-n}$ to $X_{k+n}$ extracted from the shift register array 14 are supplied to a processor 15, in which a filtering operation is carried out in accordance with control signals. The control signals are supplied from a multiplexer 16, and corresponds to the coefficients $h_0$ to $h_n$. In this example, a period of a clock pulse $CL_0$ for controlling a data-shifting operation in the shift register array 14 and that of a clock pulse $CL_1$ for changing control signals of coefficients j and $h_0$ to $h_n$ by driving the multiplexer 16 are different. Namely, four periods of the clock pulse $CL_1$ are designated during one period of the clock pulse $CL_0$ in this embodiment. Therefore, four different kinds of filtered output signals $y_k$ are obtained while the input signal is shifted by the clock pulses $CL_0$, and these output signals are divided by a multiplexer 17 into four kinds of output signals A, B, C and D in accordance with the clock pulses $CL_1$. Data a, b, c and c of the control signals inputted into the multiplexer 16 correspond to combinations of the coefficients j and $h_0$ to $h_n$.

In this embodiment, the filtering process time in the processor 15 depends only upon the switching of gate, so that the clock pulses $CL_1$ for switching filtering characteristics can be shortened to a level extremely shorter than the level of the clock pulses $CL_0$. This enables a multifiltering operation. For example, if the periods of clock pulses $CL_0$ and clock pulses $CL_1$ are 100 μs and 10 μs, respectively, ten kinds of filtering can be carried out. FIG. 11 shows the relation between the clock pulses $CL_0$ and $CL_1$ in the embodiment shown in FIG. 10. The multiplexer 16 is shown as means for applying control signals, i.e., coefficient, j and $h_0$ to $h_n$ to the processor 15. A read-only memory (ROM) 16' may also be used as shown in FIG. 10(a). The read-only memory 16 is adapted to apply predetermined data j and $h_0$ to $h_n$ to the processor 15 in accordance with the clock pulses $CL_1$.

FIGS. 12 to 15 show a different filtering characteristics obtained by the present invention. FIGS. 13 and 15 show the differentiation filtering characteristics, in which the coefficients are j=−1, h₀=0, h₁=1, h₂=1, h₃=1 and h₄=0, and j=−1, h₀=0, h₁=0, h₂=1, h₃=1 and h₄=0, respectively. FIGS. 12 and 14 show the smoothing characteristics, in which the coefficients are j=1, h₀=1, h₁=1, h₂=1, h₃=1 and h₄=0, and j=1, h₀=1, h₁=0, h₂=0, h₃=1 and h₄=0, respectively.

The above-described embodiment has the following advantages, which cannot be obtained by a prior art. (1) A plurality of different filtered output signals can be obtained within a predetermined period without changing the construction thereof. (2) A plurality of output signals having different characteristics can be obtained at the same time substantially in real time base. (3) It can safely be assumed that a plurality of filtered output signals obtained by this embodiment have the same time phase. The present invention can be used effectively to collectively analyze signal waveforms detected from a living body.

What is claimed is:

1. A digital signal processing apparatus comprising:
   a first signal processing section including delay means for generating (2p+1) signals $x_{k-n}$ to $x_{k+n}$ (n=0, 1, 2, ..., p) each having a different respective delay time and means responsive to said signals $x_{k-n}$ to $x_{k+n}$ for calculating a first output signal $$y_k = h_0 x_k + \sum_{n=1}^{p} h_n(x_{k+n} + j \cdot x_{k-n}),$$

wherein j and $h_0$ to $h_n$ are "±1" and "1" or "0", respectively;
   a second signal processing section responsive to said first output signal $y_k$ or said signal $x_k$ for calculating a second output signal in the same manner as said first signal processing section, said second signal processing section having the same construction as said first signal processing section; and
   means for delivering a third output signal from a center tap of the delay means of said second signal processing section, said second output signal and said third output signal being maintained in synchronism with one another.

2. A digital signal processing apparatus, comprising:
   a first signal processing section including first delay means for generating (2p+1) signals $X_{k-n}$ to $X_{k+n}$ (n=0, 1, 2, ..., p) each having a different respective delay time, and means responsive to said signals $X_{k-n}$ to $X_{k+n}$ for calculating a first output signal $$Y_1 = h_0 X_k + \sum_{n=1}^{p} h_n(X_{k+n} + jX_{k-n}),$$

wherein j and $h_0$ to $h_n$ are "+1" and "1" or "0", respectively;
   a second signal processing section including second delay means receiving said first output signal $Y_1$ for generating (2p+1) signals $Y_{1k-n}$ to $Y_{1k+n}$ (n=0, 1, 2, ..., p) each having a different respective delay time, and means responsive to said signals $Y_{1k-n}$ to $Y_{1k+n}$ for calculating a second output signal $$Y_2 = h_0 Y_k + \sum_{n=1}^{p} h_n(Y_{1k+n} + jY_{1k-n}),$$

wherein j and $h_0$ to $h_n$ are "±1" and "1" or "0", respectively; and
   signal delivering means for delivering a third output signal $Y_{1k}$ from a center tap of said second delay means, said third output signal being in synchronism with said second output signal with respect to a delay time.

3. A digital signal processing apparatus as in claim 2, wherein at least one of said first and second signal processing sections is a differentiating filter and wherein said $h_0$ and j are set to "0" and "−1", respectively.

4. A digital signal processing apparatus as in claim 2, wherein at least one of said first and second signal processing sections is a smoothing filter and wherein said coefficients j are set to "+1".

5. A digital signal processing apparatus as in claim 2, further comprising:
   a third signal processing section including third delay means receiving said signal $X_k$ from a center tap of said first delay means for generating (2p+1) signals $X'_{k-n}$ to $X'_{k+n}$ (n=0, 1, 2, ..., p) each having a different respective delay time and means responsive to said signals $X'_{k-n}$ to $X'_{k+n}$ for calculating a fourth output signal $$Y_3 = h_0 X'_k + \sum_{n=1}^{p} h_n(X'_{k+n} + jX'_{k-n}),$$

wherein j and $h_0$ to $h_n$ are "±1" and "1" or "0", respectively, whereby said fourth output signal $Y_3$ is in synchronism with said second and said third output signals.

6. A digital signal processing apparatus, comprising:
   delay means for generating (2p+1) signals $x_{k-n}$ to $x_{k+n}$ (n=0, 1, 2, ..., p) each having a different respective time delay, said delay means being driven by a first clock signal which is generated as a function of a second clock signal, said second clock signal having a frequency which is at least twice the frequency of said first clock signal;
   designating means responsive to said second clock signal for sequentially designating a plurality of combinations of coefficients j and $h_0$ to $h_n$ during each cycle period of said first clock signal, said coefficients j and $h_0$ to $h_n$ being "±1" and "0" or "1", respectively; and
   computing means responsive to both (1) said signals $x_{k-n}$ to $x_{k+n}$ delivered from said delay means and (2) said combinations of cooefficients for computing, during each said cycle period of said first clock signal, a plurality of output signals $$y_k = h_0 x_k + \sum_{n=1}^{p} h_n(x_{k+n} + jx_{k-n}).$$

7. A digital signal processing apparatus as in claim 6, wherein said designating means comprises a multiplexer which receives the plurality of said combinations of said coefficients j and $h_0$ to $h_n$ and which outputs one of the plurality of said combinations in response to said second clock signal, said second clock signal having a frequency which is equal to an integer multiple of said first clock signal.

8. A digital signal processing apparatus as in claim 7, further comprising signal delivering means for receiving said output signal $y_k$ computed in response to said second clock signal by said computing means for delivering a plurality of respective output signals in parallel.

9. A digital signal apparatus as in claim 6, wherein said designating means comprises a memory in which the plurality of said combinations of said coefficients j and $h_0$ to $h_n$ are pre-stored and which outputs one of the plurality of said combinations in response to a second clock signal, said second clock signal having a frequency which is equal to an integer multiple of said first clock signal.

* * * * *